United States Patent

Yoshida et al.

[11] Patent Number: 6,080,970
[45] Date of Patent: Jun. 27, 2000

[54] WAFER HEATING APPARATUS

[75] Inventors: Masao Yoshida; Suehiro Imaizumi, both of Kokubu, Japan

[73] Assignee: Kyocera Corporation, Kyoto, Japan

[21] Appl. No.: 09/218,996

[22] Filed: Dec. 22, 1998

[30] Foreign Application Priority Data

Dec. 26, 1997 [JP] Japan ................................. 9-360092

[51] Int. Cl.$^7$ ..................................................... H05B 3/68
[52] U.S. Cl. ........................ 219/444.1; 118/725; 219/540
[58] Field of Search ............................. 219/443.1, 444.1, 219/449.1, 451.1, 468.1, 540, 544, 552; 118/725; 338/248, 249

[56] References Cited

U.S. PATENT DOCUMENTS

| | | | |
|---|---|---|---|
| 5,063,031 | 11/1991 | Sato ........................................ | 118/725 |
| 5,336,324 | 8/1994 | Stall et al. ............................... | 118/725 |
| 5,343,022 | 8/1994 | Gilbert, Sr. et al. .................... | 118/725 |
| 5,344,492 | 9/1994 | Sato et al. ............................... | 118/725 |
| 5,700,992 | 12/1997 | Honda et al. ......................... | 219/444.1 |
| 5,766,363 | 6/1998 | Mizuno et al. ......................... | 118/725 |
| 5,904,872 | 5/1999 | Arami et al. ............................. | 219/544 |

FOREIGN PATENT DOCUMENTS 6052974  2/1994  Japan .

Primary Examiner—Teresa Walberg
Assistant Examiner—Fadi H. Dahbour
Attorney, Agent, or Firm—Hogan & Hartson LLP

[57] ABSTRACT

In order to achieve concentric distribution of temperatures over a wafer supporting surface and improve the uniformity of heating, a heating resistor 4 having a configuration for providing a predetermined heater pattern buried in a ceramic substrate 2 constituting a wafer heating apparatus is made from arc portions 4a–4g which have different radii and are arranged to form concentric circles disposed at substantially the same intervals and straight portions 4h–4m which connect those of the arc portions 4a–4g that are adjacent to each other in the radial direction thereby to form a series circuit, while the arc portions 4a–4g and the straight portions 4h–4m are made in substantially the same strip width and the distance L1 between a pair of straight portions among the straight portions 4h–4m which are located on the same circle is made less than the distance L2 between the arc portions which are adjacent to each other in the radial direction.

11 Claims, 8 Drawing Sheets

WAFER HEATING APPARATUS

BACKGROUND OF THE INVENTION

1. Filed of the Invention

The present invention relates to a wafer heating apparatus used to treat and heat a wafer placed thereon, particularly in filmmaking or etching on a wafer in processes of semiconductor devices.

In filmmaking apparatuses such as plasma CVD, low pressure CVD, optical CVD or PVD systems, or in etching apparatuses based on plasma etching or optical etching technique in the production step of semiconductor devices.

2. Prior Art wafer heating apparatuses have been used to treat wafers in filmmaking systems such as plasma CVD, low pressure CVD, optical CVD or PVD systems, or in etching systems based on plasma etching or optical etching technique, particularly, for production of semiconductor devices.

In the filmmaking systems, corrosive gases, such as chlorine and fluorine gases, have been used as a deposition gas, an etching gas and a cleaning gas in the plasma CVD system, or other depositing and etching systems in the processes for producing semiconductor devices.

As wafer heating apparatus for holding a wafer, including a semiconductor wafer (hereinafter referred to as "wafer"), in such an atmosphere of the above gas and heating the wafer to a process temperature, a stainless heater incorporating a heating resistor therein has been used.

However, the stainless heater has the problem that the heater is apt to be corroded while being exposed to the above corrosive gases, which results in producing particles to be separated from the wafer holder.

On the other hand, a method has been adopted in which a wafer heating apparatus have been made of graphite, which has relatively high corrosion resistance to such corrosive gases, and have been indirectly heated by infrared lamps outside a chamber. But this had a drawback of lower heat efficiency compared to direct heating process. Moreover the method also has the problem that for a filmmaking system a film deposits on the surface interior wall of the chamber, and a great deal of light form the lamps is absorbed in the film attached on the window glass for the lamps, thus making the wafer heating apparatus unable to heat.

As a wafer heating apparatus which eliminates the problems described above, Japanese Patent Publication JP-A 6-52974 discloses a wafer heating apparatus 11 in which the top surface of a dense ceramic substrate 12 of disk shape as shown in FIG. 9, is used as a supporting surface 13 for a wafer W, and a heating wire resistor 14 formed of a metal having a high melting point and a planular-section is buried in the disk ceramic substrate. The heating resistor 14 buried in the apparatus 11 is provided in a spiral configuration in the area if the disk ceramics as a heater pattern, as shown in FIG. 10.

However, the wafer heating apparatus 11 has a problem that the spiral heating wire resistor is difficult to uniformly heat the wafer W placed on the supporting surface 13. In the other words, with the heating resistor made in the spiral configuration, the planular-section wire heating resistor 14 is interrupted at one end thereof in the periphery of the ceramic substrate 12, thus causing poor uniformity of heating in the periphery of the wafer heating apparatus 11, resulting in significant unevenness in heating of the supporting surface 13 as a whole, thus failing to heat the wafer W uniformly.

Consequently, when a film is formed by using the wafer heating apparatus 11, the film cannot be formed with a uniform thickness on the water W and, in the case of etching process, there have been such problems as significant variations in the processing accuracy, resulting in poor product yield.

SUMMARY OF THE INVENTION

An object of the present invention is to provide a wafer heating apparatus capable of producing uniform distribution of temperatures on all the area on the top surface to uniformly heat a wafer.

Another object of the present invention is to provide a wafer heating apparatus capable of forming a film with a uniform thickness on the wafer W.

In order to achieve the object, according to the present invention, uniformity of heating the supporting surface of the wafer heating apparatus is improved by forming a strip heating resistor in concentric circles as the ideal heater pattern of the heating resistor. In a first aspect of the present invention, a wafer heating apparatus comprises a disk-shaped ceramic substrate whose top surface serves as a wafer supporting surface, and a strip heating resistor having a configuration for providing a predetermined heater pattern buried therein, wherein the heating resistor is made in a configuration of substantially concentric circles by continuously connecting arc portions and straight portions which have substantially the same widths, while the distance between a pair of straight portions located on the same circle is made shorter than the distance between arc portions which are adjacent to each other in the radial direction.

When the distance between the pair of straight portions located on the same circle is set in a range from 50% to 80% of the distance between the arc portions which are adjacent to each other in the radial direction, in particular, temperature distribution in the supporting surface can be made uniform, thus performing uniform heating.

In a second aspect, the present invention provides a wafer heating apparatus comprising a disk-shaped ceramic substrate whose top surface serves as a wafer supporting surface, and a strip heating resistor having a configuration for providing a predetermined heater pattern buried therein, wherein the heating resistor is made in a configuration of substantially concentric circles by continuously connecting arc portions which have substantially the same widths and straight portions, while the distance between a pair of straight portions located on the same circle is made shorter than the distance between arc portions which are adjacent to each other in the radial direction, and the resistance per unit length of the straight portions is made less than the resistance per unit length of the arc portion.

Resistance per unit length of the straight portion can be made less than resistance per unit length of the arc portion either by making the strip width of the straight portion longer than the strip width of the arc portion, or by connecting another straight portion above and/or below the straight portion.

According to the first aspect, because the strip heating resistor buried in the ceramic substrate is made in a configuration of substantially concentric circles by continuously connecting the arc portions and the straight portions which have substantially the same strip width, uniformity of heating is not impaired in the periphery of the supporting surface unlike the wafer heating apparatuses of the prior art.

In order to improve the uniformity of heating the supporting surface, it is necessary to make the arc portion and the straight portion generate the same amount of heat per unit volume. For this purpose, such a design is employed as the distance between a pair of straight portions located on a circle and the distance between the arc portions which are adjacent to each other in the radial direction are made equal. However, the inventors of the present application found that the resistance of a bend portion between the arc portion and the straight portion is less than that of other portions thus resulting in impaired uniformity of heating, and therefore made the distance between a pair of straight portions located on the same circle less than the distance between arc portions which are adjacent to each other in the radial direction. This made it possible to increase the amount of heat generated in the straight portion to a level substantially equal to that of the arc portion and to decrease the distance of the pair of straight portions, thereby making the arc portions located on the same circle approximate a circle, and as a result the heating resistor can be made in an approximately concentric configuration so that the temperature of the supporting surface is distributed concentrically, thus improving the uniformity of heating.

Also according to the second aspect, because the distance between a pair of straight portions located on the same circle is made shorter than the distance between the arc portions which are adjacent to each other in the radial direction, and resistance per unit length of the straight portion is made less than the resistance per unit length of the arc portion, the distance between the pair of straight portions located on the same circle can be decreased further, thereby making the arc portions located on the same circle more closely approximate a circle, thus further improving the uniformity of heating the supporting surface.

The wafer heating apparatus of the present invention is made in a configuration of substantially concentric circles by continuously connecting the arc portions and the straight portions which have substantially the same width as described above, and therefore, energization of the heating resistor causes the temperature of the supporting surface to be distributed concentrically and improves the uniformity of heating, thus making it possible to heat the wafer W placed on the supporting surface uniformly.

As a result, the wafer heating apparatus of the present invention is, when applied to filmmaking on a wafer, capable of forming a film of uniform thickness on the wafer and, when applied to etching process, capable of finishing the surface to a high accuracy. Therefore, it is possible to apply fine processing with high accuracy and to provide high quality products.

BRIEF DESCRIPTION OF THE DRAWINGS

Embodiments of the invention will be described in greater detail below in reference to the accompanying the drawings, in which.

DESCRIPTION OF THE PREFERRED EMBODIMENTS

Figure 1A:
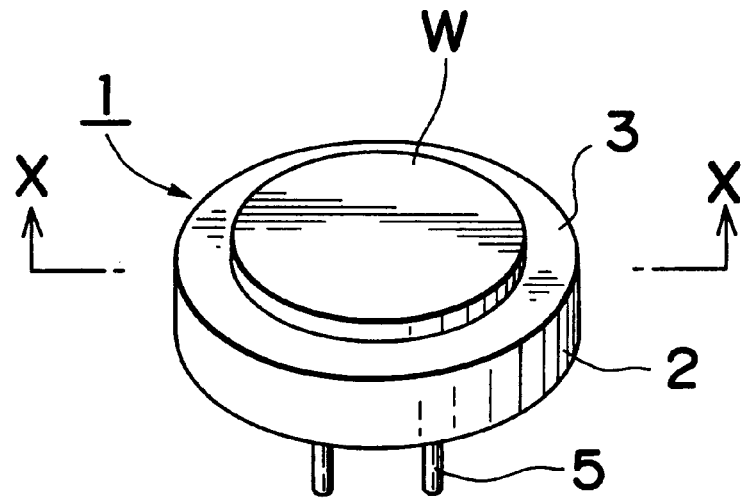
FIG. 1A is a perspective view showing the wafer heating apparatus of the present invention referred to as a susceptor.
Figure 1B:
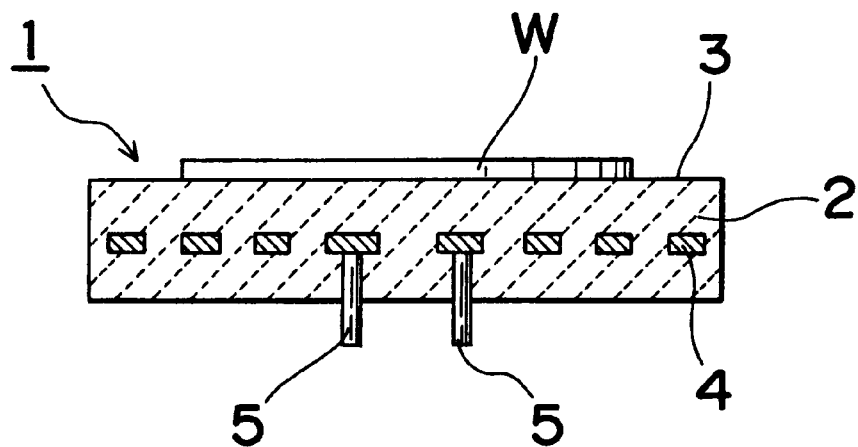
FIG. 1B is a cross sectional view taking along lines X—X of the apparatus in FIG. 1A.

As shown in FIGS. 1A and 1B, a wafer heating apparatus 1 of the present invention referred to as a susceptor comprises a disk-shaped dense ceramic substrate 2 whose top surface serves as a supporting surface 3 for a wafer W, and a strip heating resistor 4 is buried therein. Electric supply terminals 5 for supplying electricity to the heating resistor 4 are attached at the center of the bottom surface of the ceramic substrate 2. The wafer W placed on the supporting surface 3 is uniformly heated by applying a voltage to the supply terminals 5 thereby causing the heating resistor 4 to generate heat.

As the material of the ceramic substrate 2 constituting the wafer heating apparatus 1, alumina, silicon nitride, sialon and aluminum nitride which have high wear resistance and high heat resistance may be used.

Among these materials, aluminum nitride which has a high thermal conductivity not less than 50 W/mk or sometimes 100 W/mk or higher, high resistance against corrosion by corrosive gases such as fluorine and chlorine gases and high resistance against plasma, in particular, is suitable for the material of the ceramic substrate 2. Especially, high-purity aluminum nitride having a purity of 99.7% or higher and aluminum nitride including a sintering agent such as $Y_2O_3$ and $Er_2O_3$ may be used.

As the material to make the heating resistor 4 buried in the ceramic substrate 2, metals having high melting points such as tungsten, molybdenum, rhenium and platinum or alloys thereof, or carbides and nitrides of metals belonging to Groups IV4a, Va and Via in the Periodic Table of the Elements may be used. Among these materials, those having thermal expansion coefficients nearer to that of the ceramic substrate 2 are selected.

The heating resistor 4 buried in the ceramic substrate 2 is made in a configuration of substantially concentric circles by continuously connecting arc portions 4a–4g and straight portions 4h–4m which have substantially the same widths. That is, the heating resistor 4 comprises the arc portions 4a–4g which have different radii and are arranged substantially at the same intervals to form substantially concentric configuration and straight portions 4h–4m which connect those of the arc portions 4a–4g which are adjacent to each other in the radial direction, thereby to form a series circuit, with ends of the arc portions 4a, 4b being used as lead terminals 4n. Consequently, because a pair of the arc portion 4a and the arc portion 4b, a pair of the arc portion 4c and the arc portion 4d, a pair of the arc portion 4e and the arc portion 4f, and the arc portion 4g are each arranged to form a circle, with the circles arranged concentrically, energization of the heating resistor 4 causes the temperature of the supporting surface 3 to be distributed concentrically from the center to the periphery of the supporting surface 3.

Also because the pair of the arc portions 4a, 4b, the pair of the arc portions 4c, 4d, the pair of the arc portions 4e, 4f and the arc portion 4g which adjoin each other in the radial direction are arranged at nearly equal distance L2, the arc portions 4a–4g can be made to generate the same heat capacity of heat per unit volume, thus eliminating the variation in heating in the radial direction of the supporting surface 3.

It is important to dispose the pair of the straight portion 4h and the straight portion 4i, the pair of the straight portion 4j and the straight portion 4k, and the pair of the straight portion 4l and the straight portion 4m which are located on the same circles at a distance L1 smaller than the distance L2 between the pairs of the arc portions 4a–4g which are adjacent to each other in the radial direction.

Figure 3:
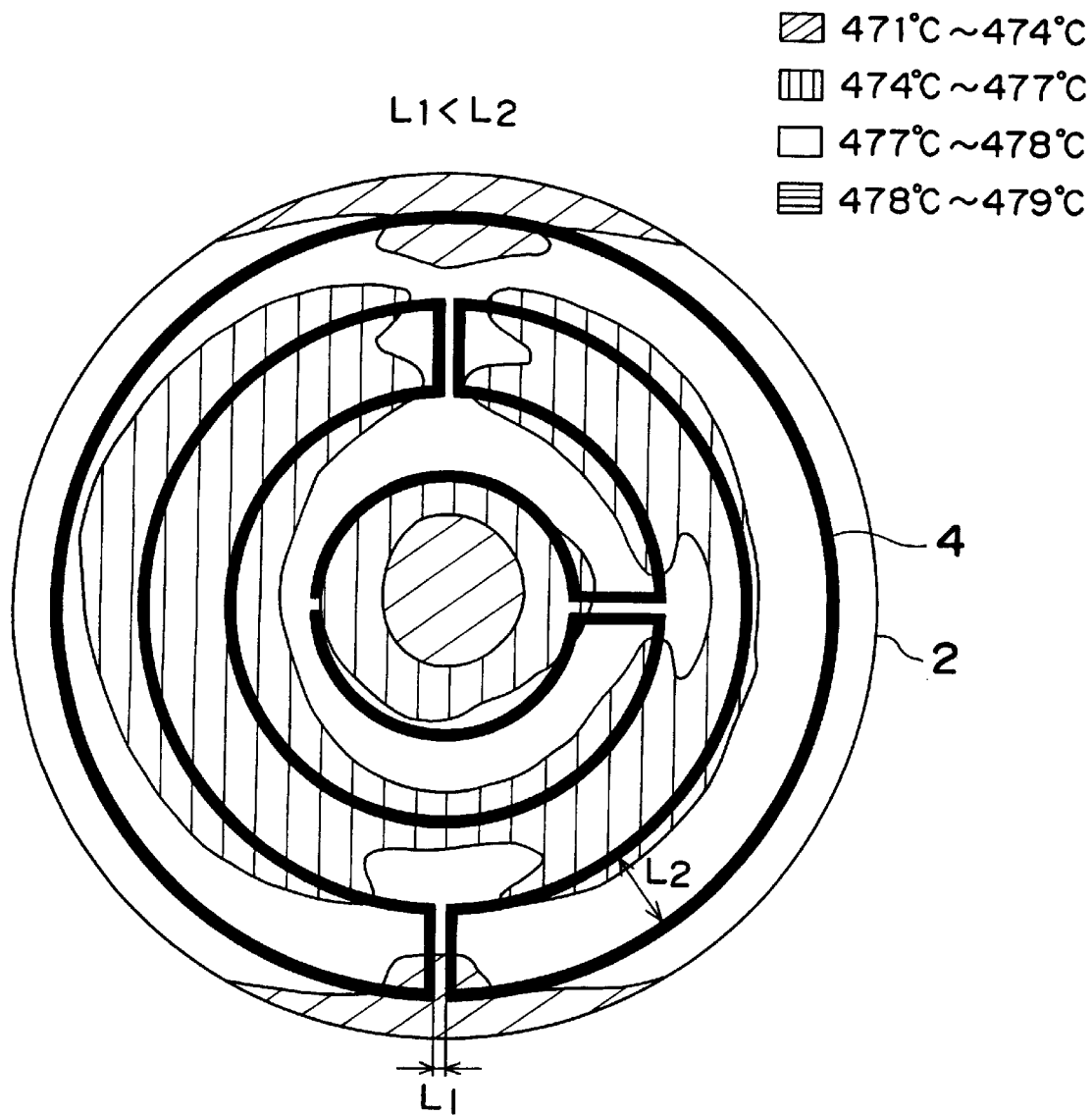
FIG. 3 is a schematic diagram showing the temperature distribution over the supporting surface in the wafer heating apparatus of the present invention.
Figure 4:
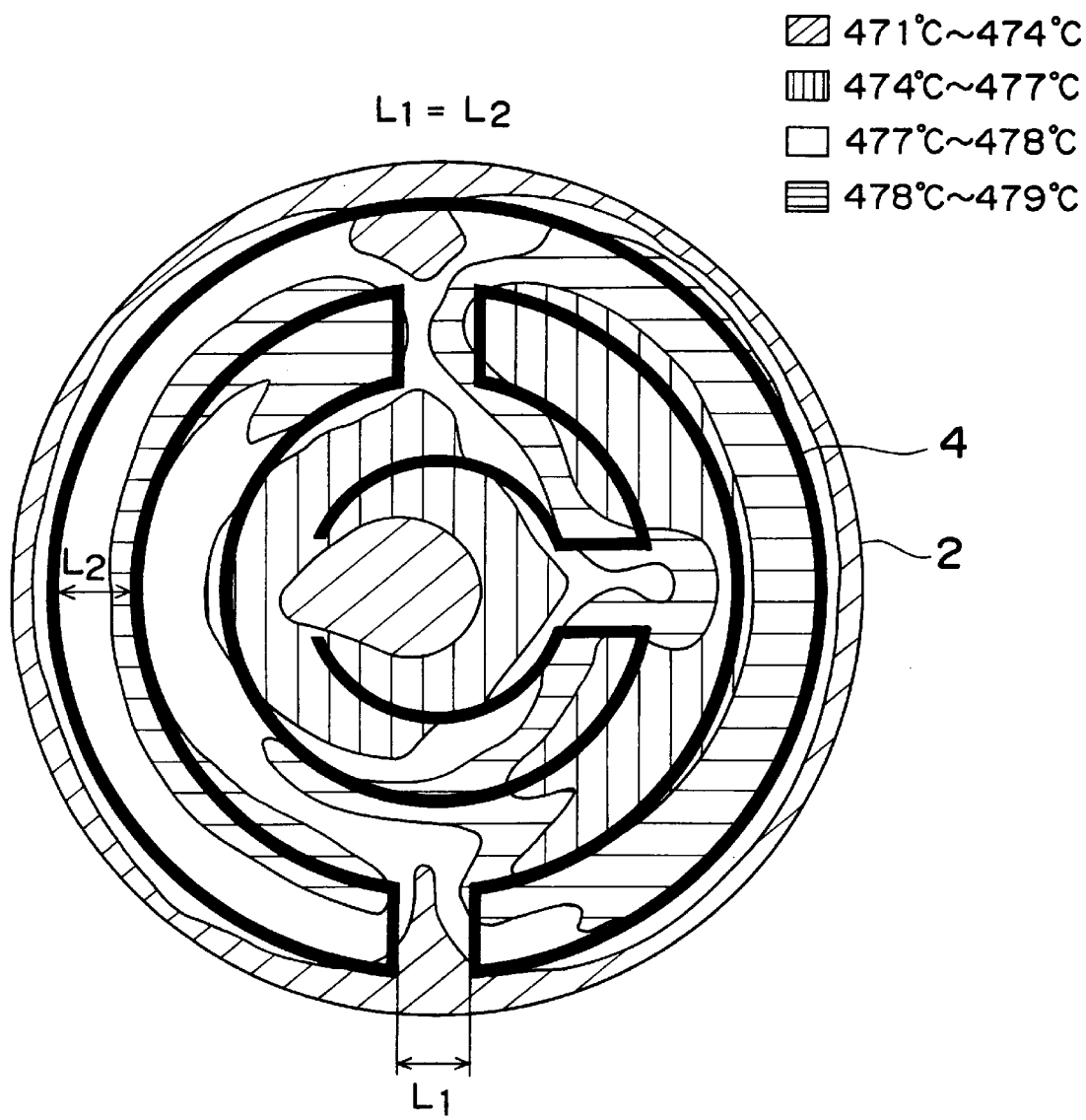
FIG. 4 is a schematic diagram showing the temperature distribution over the supporting surface in a wafer heating apparatus used for comparison.

In order to improve the uniformity of heating the supporting surface 3, it is necessary to make the straight portions 4h–4m, as well as arc portions 4a–4g, generate the same amount of heat per unit volume. Thus usually such a design is employed as the distance L1 between a pair of straight portions among the straight portions 4h–4m located on the same circle and the distance L2 between those of the arc portions 4a–4g which are adjacent to each other in the radial direction are made equal. However, the resistance of a junction P between the arc portion and the straight portion is less than that of the other portions leading to smaller heat capacity of the straight portions 4h–4m, thus resulting in impaired uniformity of heating as shown in the temperature distribution over the supporting surface in FIG. 4. According to the present invention, on the other hand, because the distance L1 between the pair of straight portions 4h–4m located on the same circle is made less than the distance L2 between those of the arc portions 4a–4g which are adjacent to each other in the radial direction, heat capacity of the of straight portions 4h–4m can be increased to a value near the heat capacity of the adjacent arc portions 4a–4g, thus making it possible to achieve concentric temperature distribution over the supporting surface 3 as shown in FIG. 3 and improving the uniformity of heating.

When the distance L1 between a pair of those among the straight portions 4h–4m located on the same circle is set in a range from 50% to 80% of the distance L2 between those of the arc portions 4a–4g which are adjacent to each other in the radial direction, in particular, best performance of uniform heating of the supporting surface 3 can be obtained.

Figure 2:
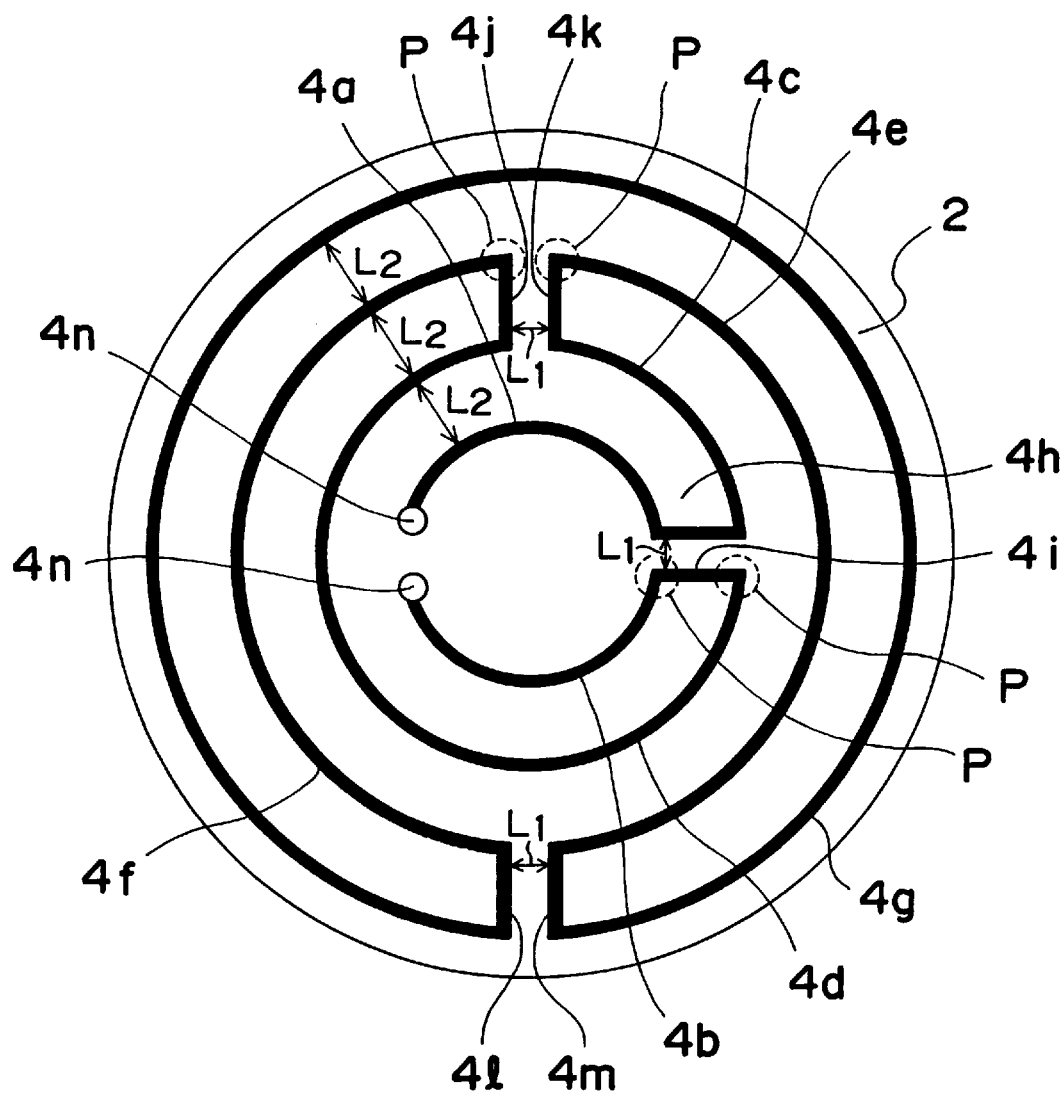
FIG. 2 is a schematic diagram showing a configuration for providing a heater pattern of a heating resistor.
Figure 5:
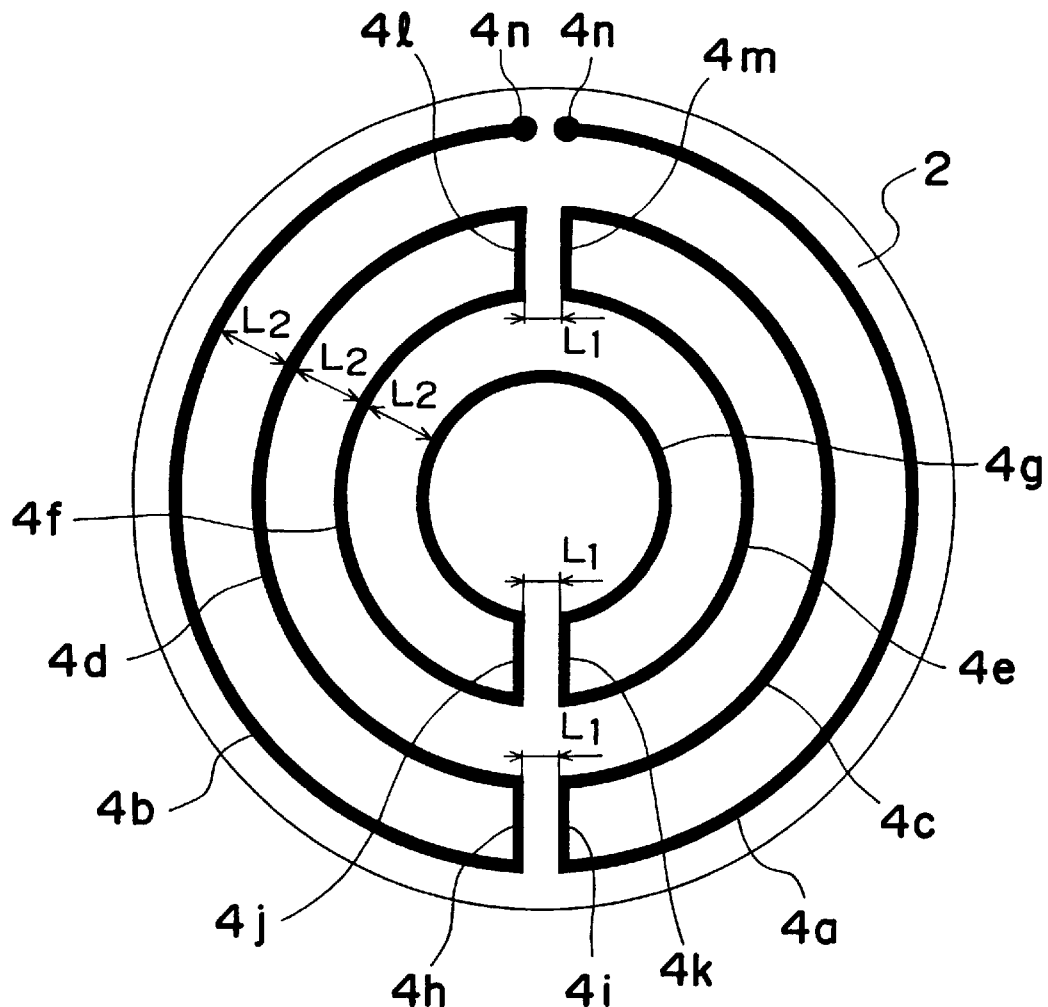
FIG. 5 is a schematic diagram showing another configuration for providing a heater pattern of the heating resistor.

According to the present invention, the configuration of the heating resistor 4 is not limited to that shown in FIG. 2, and such a configuration as shown in FIG. 5 where a lead terminals 4n are attached to the periphery of the ceramic substrate 2 may also be employed.

The wafer heating apparatus 1 as described above is produced by a method of steps of mixing various ceramics powders with a sintering agent, a binder and a solvent to make a slip for producing the ceramic substrate 2 as described previously; forming a plurality of green sheets by a tape forming technique such as doctor blade technique from the slip; laminating the several green sheets; applying a conductive paste for making a heating resistor 4 on the top surface of any one of laminate sheets using a screen printing machine in the heater pattern as shown in FIG. 2; and overlaying the remaining green sheets on the sheet attaching the past for the resistor; and then cutting the laminated green sheets into a disk.

The green sheet disk is then heated to a temperature high enough to sinter various ceramic powders, thereby making the ceramic laminate 2 with the heating resistor 4 having a configuration for providing a predetermined heater pattern shown in FIG. 2 buried therein. The top surface of the ceramic substrate 2 is polished to form a supporting surface 3 for the wafer W, and two holes are provided at the center of the ceramic substrate 2 from the bottom surface thereof to penetrate through the heating resistor 4 to the lead terminal 4n. Electric supply terminals 5 are inserted into the holes and electrically connected to the heating resistor 4 by brazing, thereby completing the wafer heating apparatus 1 of the present invention.

The ceramic substrate 2 in which the heating resistor 4 is buried may also be produced by another process. For example, after applying the electrically conductive paste for making the heating resistor 4 on a ceramic plate by using a screen printing machine in the configuration for providing a predetermined heater pattern shown in FIG. 2, the ceramic plate having the heating resistor 4 is sintered. The ceramic plate is placed in a mold which is then filled with ceramic powder of the same material as that of the ceramic plate to cover the heating resistor 4, and the ceramic plate and the ceramic powder are hot-pressed into an integral body. Alternatively, a ceramic film of the same material as that of the ceramic plate may be formed on the ceramic plate having the heating resistor 4, thereby to cover the heating resistor 4 by a thin-film-making process such as CVD or PVD process.

Figure 6:
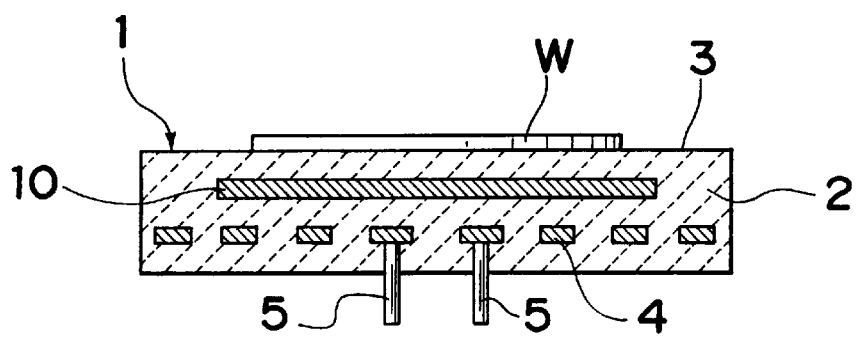
FIG. 6 is a cross sectional view showing another wafer heating apparatus of the present invention.

Although FIGS. 1A and 1B show the wafer heating apparatus 1 having only the heating resistor 4 buried in the ceramic substrate 2, the present invention may also be applied to such a configuration as a film electrode 10 is buried between the wafer supporting surface 3 and the heating resistor 4 for the purpose of electrostatic attraction or generating plasma, as shown in FIG. 6. When the film electrode 10 is used for electrostatic attraction, the wafer W can be firmly brought into close contact with the supporting surface 3 thus achieving higher performance of heat transfer between the supporting surface 3 and the wafer W, and therefore even better uniformity of heating can be obtained. When the film electrode 10 is used for generating plasma, one of the plasma generating electrodes installed in the apparatus can be eliminated, and therefore the apparatus can be made smaller while the increased plasma density makes it possible to improve the film making performance and etching performance.

Figure 7:
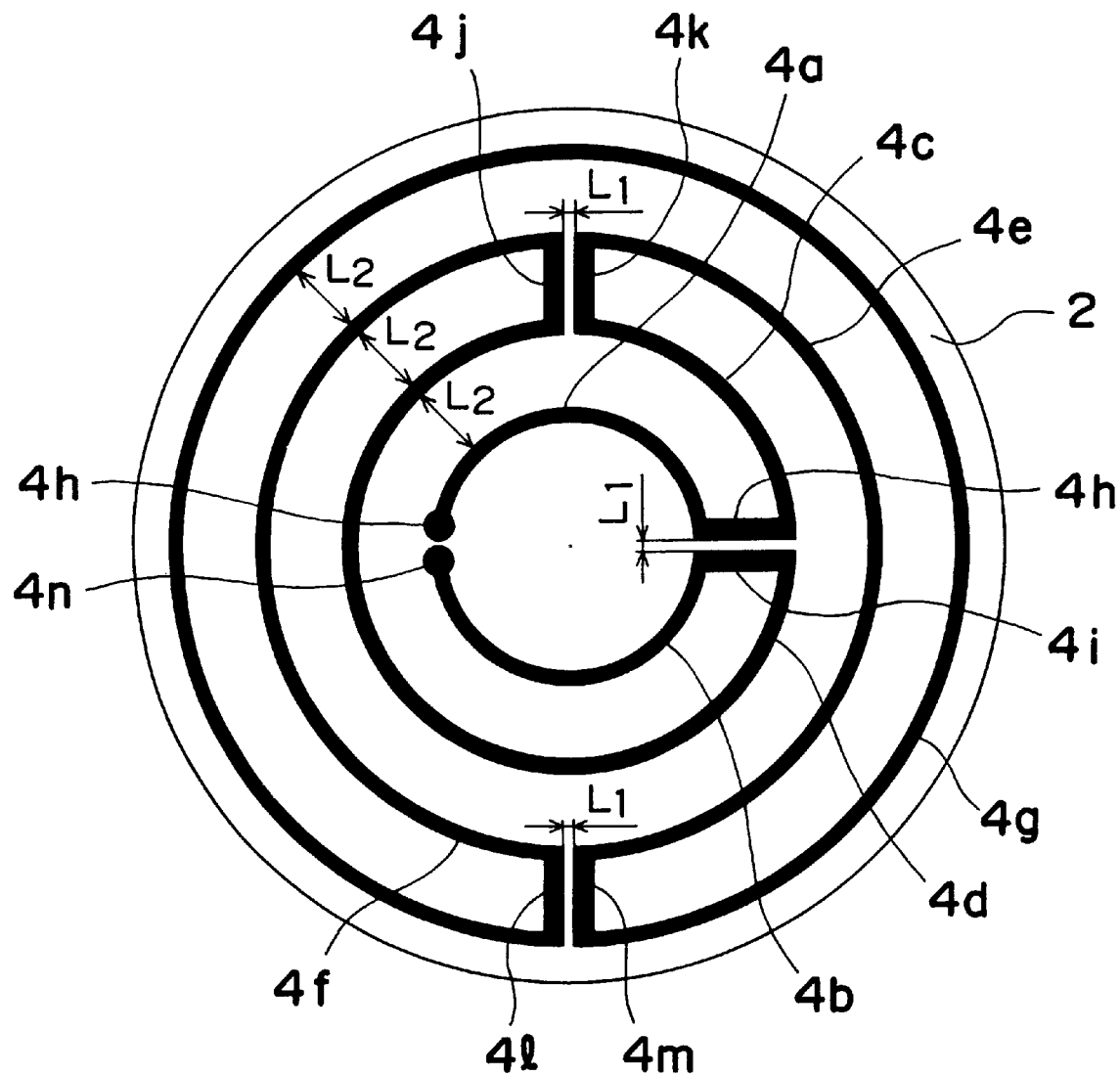
FIG. 7 is a schematic diagram showing another configuration for providing a heater pattern of the heating resistor.

Another embodiment of the present invention is shown in FIG. 7 which is a schematic diagram showing another configuration of the heating resistor 4. The heating resistor 4 of this embodiment is substantially similar to that of FIG. 2, except that the distance L1 between a pair of straight portions among the straight portions 4h–4m located on the same circle is made shorter than the distance L2 between those of the arc portions 4a–4g which are adjacent to each other in the radial direction, and the strip width of the straight portions 4h–4m is made longer than the strip width of the arc portions 4a–4g, thereby making the resistance per unit length of the straight portions 4h–4m lower than the resistance of unit length of the arc portions 4a–4g.

Thus because the amount of heat generated by the straight portions 4h–4m can be decreased further by making the resistance per unit length of the straight portions 4h–4m lower than the resistance of unit length of the arc portions 4a–4g, heat generated between a pair of those among the straight portions 4h–4m can be increased to a value near the heat generated by the arc portions 4a–4g, thus making it possible to decrease the distance L1 between the straight portions 4h–4m. Consequently, the pair of the arc portion 4a and the arc portion 4b, the pair of the arc portion 4c and the arc portion 4d, the pair of the arc portion 4e and the arc portion 4f and the arc portion 4g can be made even closer to circles, thereby further suppressing the variation in heating of the supporting surface 3.

Figure 8:
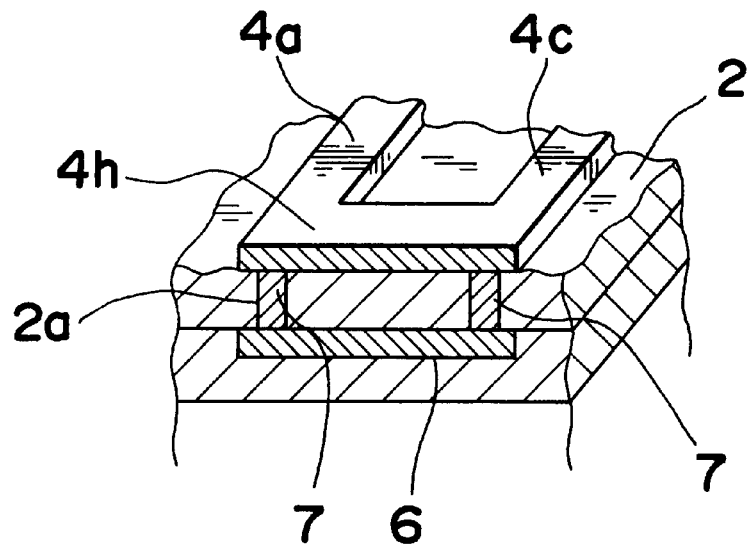
FIG. 8 is a perspective view showing only the vicinity of a straight portion of another configuration for providing a heater pattern of the heating resistor.
Figure 9:
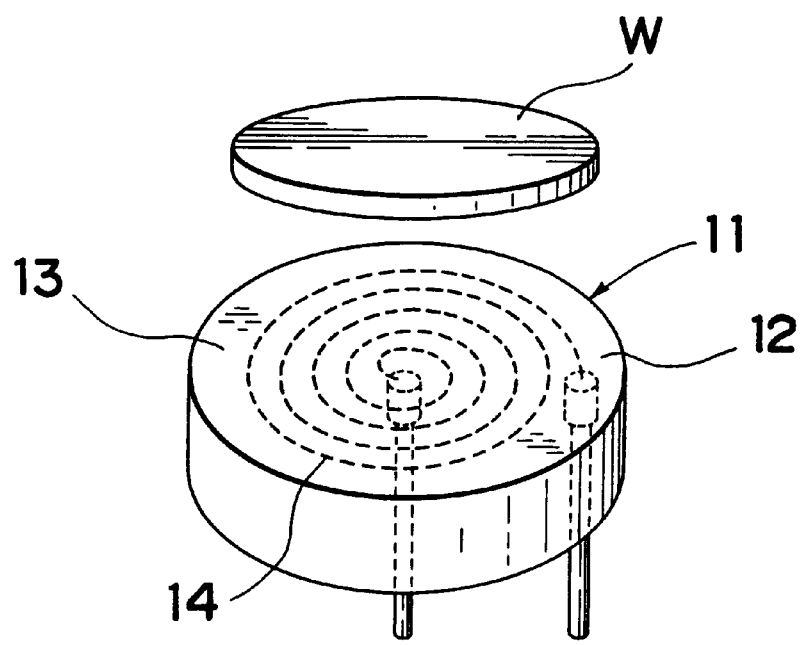
FIG. 9 is a perspective view showing prior art wafer heating apparatus.
Figure 10:
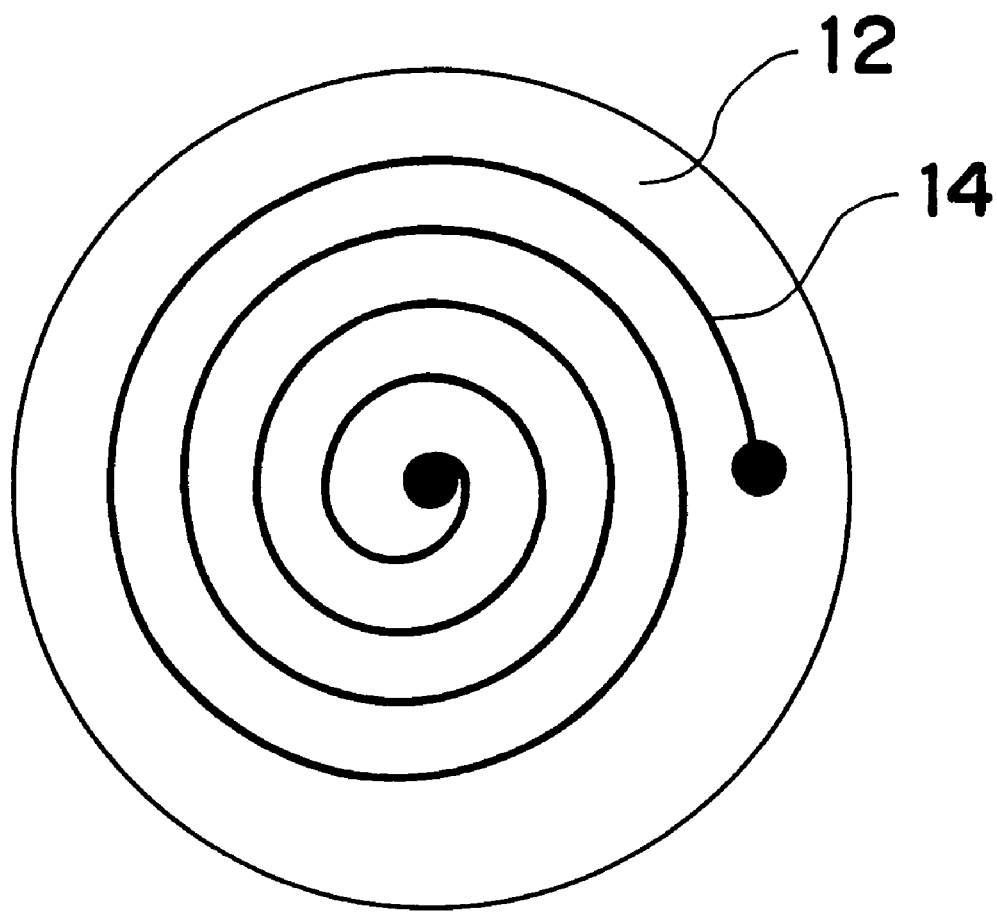
FIG. 10 is a schematic diagram showing the configuration for providing a heater pattern of the heating resistor buried in the prior art wafer heating apparatus shown in FIG. 9.

FIG. 8 is a perspective view showing only the vicinity of the straight portion of further another configuration of the heating resistor 4. The heating resistor 4 of this embodiment has a similar configuration to that of FIG. 2, except that another straight portion 6 is provided below the straight portions 4h–4m, with these portions being connected in parallel, thereby making the resistance per unit length of the straight portions 4h–4m lower than the resistance of unit length of the arc portions 4a–4g.

This configuration also increases the heat capacity of heat generated by the straight portions 4h–4m to a value near the heat capacity generated by the arc portions 4a–4g, thus making it possible to further decrease the distance L1 between the straight portions 4h–4m. Consequently, the pair of the arc portion 4a and the arc portion 4b, the pair of the arc portion 4c and the arc portion 4d, the pair of the arc portion 4e and the arc portion 4f and the arc portion 4g can be made even closer to circles, thereby further suppressing the variation in heating of the supporting surface 3.

The heating resistor having the configuration shown in FIG. 8 can be easily produced by the method of the present invention where the ceramic substrate 2 and the heating resistor 4 are laminated one on another as follows. An electrically conductive paste is printed on the top surface of the green sheet in the configuration shown in FIG. 2, and via holes 2a are formed in the green sheet at the positions of the junctions P of the straight portions 4h–4m. The via holes 2a are filled with an electrically conductive material to form via hole conductors 7 and the electrically conductive paste is printed on the bottom surface of the green sheet in a straight line connected to the via hole conductors 7. With another green sheet being laminated thereon, the laminate is sintered as a whole.

We claim:

1. A wafer heating apparatus comprising a disk-shaped ceramic substrate whose top surface serves as a wafer supporting surface, and a strip heating resistor having a configuration for providing a predetermined heater pattern buried therein, wherein the heating resistor is made in a configuration of substantially concentric circles by continuously connecting arc portions and straight portions which have substantially the same widths, the straight portions being arranged to face each other in adjacent pairs thereon, with each pair of the straight portions extending between and connecting arc portions along the same adjacent pair of concentric circles, while the distance between the adjacent pairs of straight portions is made shorter than the distance between arc portions which are adjacent to each other in the radial direction.

2. A wafer heating apparatus according to claim 1, wherein the distance between the adjacent pairs of straight portions is set in a range from 50% to 80% of the distance between arc portions which are adjacent to each other in the radial direction.

3. A wafer heating apparatus comprising a disk-shaped ceramic substrate whose top surface serves as a wafer supporting surface, and a strip heating resistor having a configuration for providing a predetermined heater pattern buried therein, wherein the heating resistor is made in a configuration of substantially concentric circles by continuously connecting arc portions which have substantially the same widths and straight portions, the straight portions being arranged to face each other in adjacent pairs thereon, with each pair of the straight portions extending between and connecting arc portions along the same adjacent pair of concentric circles, while the distance between the adjacent pairs of straight portions is made shorter than the distance between arc portions which are adjacent to each other in the radial direction, and the resistance per unit length of the straight portions is made less than the resistance per unit length of the arc portions.

4. A wafer heating apparatus according to claim 3, wherein the strip width of the adjacent pairs of straight portions is made longer than the strip width of the arc portions, and the resistance per unit length of the straight portions is made less than the resistance per unit length of the arc portions.

5. A wafer heating apparatus comprising a disk-shaped ceramic substrate whose top surface serves as a wafer supporting surface, and a strip heating resistor having a configuration for providing a predetermined heater pattern buried therein, wherein the heating resistor is made in a configuration of substantially concentric circles by continuously connecting arc portions and straight portions which have substantially the same widths, while the distance between a pair of straight portions located on the same circle is made shorter than the distance between arc portions which are adjacent to each other in the radial direction, and the resistance per unit length of the straight portions is made less than the resistance per unit length of the arc portions by connecting another straight portion above or below the straight portion in parallel.

6. A wafer heating apparatus according to claim 1 or 2, wherein the ceramic substrate comprises aluminum nitride.

7. A wafer heating apparatus according to claim 6, wherein the ceramic substrate comprises high purity aluminum nitride having purity of 99.7% or more.

8. A wafer heating apparatus according to claim 6, wherein the ceramic substrate comprises a sintering agent comprised of $Y_2O_3$ or $Er_2O_3$.

9. A wafer heating apparatus according to any one of claims 3 to 5, wherein the ceramic substrate comprises aluminum nitride.

10. A wafer heating apparatus according to claim 9, wherein the ceramic substrate comprises high purity aluminum nitride having purity of 99.7% or more.

11. A wafer heating apparatus according to claim 9, wherein the ceramic substrate comprises a sintering agent comprised of $Y_2O_3$ or $Er_2O_3$.

* * * * *